(12) United States Patent
Tabatowski-Bush

(10) Patent No.: US 9,411,004 B2
(45) Date of Patent: Aug. 9, 2016

(54) CONTINUOUS LEAKAGE DETECTION CIRCUIT WITH INTEGRATED ROBUSTNESS CHECK AND BALANCED FAULT DETECTION

(71) Applicant: Ford Global Technologies, LLC, Dearborn, MI (US)

(72) Inventor: Benjamin A. Tabatowski-Bush, South Lyon, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 136 days.

(21) Appl. No.: 14/288,427

(22) Filed: May 28, 2014

(65) Prior Publication Data

US 2015/0346257 A1      Dec. 3, 2015

(51) Int. Cl.
  *G01R 31/00* (2006.01)
  *G01R 31/02* (2006.01)
  *G01R 31/36* (2006.01)

(52) U.S. Cl.
  CPC ............ *G01R 31/025* (2013.01); *G01R 31/006* (2013.01); *G01R 31/3651* (2013.01)

(58) Field of Classification Search
  CPC . G01R 31/006; G01R 31/025; G01R 31/3651
  See application file for complete search history.

(56) References Cited

U.S. PATENT DOCUMENTS

| | | | |
|---|---|---|---|
| 5,481,194 A | 1/1996 | Schantz | |
| 6,731,116 B2 * | 5/2004 | Yamamoto | B60L 3/0015 324/503 |
| 7,417,438 B2 * | 8/2008 | Miyamoto | G01R 19/16542 320/121 |
| 7,453,232 B2 * | 11/2008 | Furukawa | H02J 7/0021 320/104 |
| 7,592,815 B2 | 9/2009 | Yano | |
| 8,779,784 B2 * | 7/2014 | Yang | G01R 27/16 324/426 |
| 2004/0189330 A1 * | 9/2004 | Herb | G01R 27/18 324/691 |
| 2008/0054907 A1 | 3/2008 | Kudo | |
| 2012/0221269 A1 | 8/2012 | Wanner | |
| 2013/0099826 A1 * | 4/2013 | Kondo | H03K 17/145 327/89 |

OTHER PUBLICATIONS

U.S. Appl. No. 14/104,243, filed Dec. 12, 2013, Tabatowski-Bush.
A Novel On-line Self-Learning State-of-Charge Estimation of Battery Management System for Hybrid Electric Vehicle, Yan, Jingyu, et al.; Jun. 3, 2009. (Abstract) http://ieeexplore.ieee.org/xpl/articleDetails.jsp?arnumber=5164446.

* cited by examiner

*Primary Examiner* — Jeff Natalini
(74) *Attorney, Agent, or Firm* — Maristyn Law LLC; Lynda F. Kouroupis; David B. Kelley

(57) ABSTRACT

A leakage detection circuit with integrated robustness check provides leakage detection and continuous robustness check capability. A circuit can include a first voltage divider coupled to a chassis ground and a positive terminal of a traction energy storage device (ESD). A second voltage divider, connected in series to the first voltage divider, can be coupled to the chassis ground and a negative terminal of the ESD. A third voltage divider can be coupled to both the positive and negative ESD terminals. A checkproduct based on a voltage detected at the third voltage divider can be compared to a sum VS of voltages detected at first and second voltage dividers to check for a circuit fault. Voltages detected at the first and second voltage dividers, and SOC values, can be used to detect leakage faults, including balanced leakage faults, and a fault response can be performed.

22 Claims, 5 Drawing Sheets

CONTINUOUS LEAKAGE DETECTION CIRCUIT WITH INTEGRATED ROBUSTNESS CHECK AND BALANCED FAULT DETECTION

FIELD OF INVENTION

This invention relates generally to leakage detection circuits for electrified vehicles, and more particularly to leakage detection circuits with robustness checks.

BACKGROUND OF INVENTION

Electrified vehicles employ an electric drive system configured to provide propulsion to assist or replace that provided by an internal combustion engine. The electric drive system typically includes a high voltage energy storage device, such as a high voltage battery, coupled by high voltage buses to a power conversion system that provides alternating current to an electric motor. A high voltage battery can comprise a plurality of electrically connected battery cells. Insufficient cell charge, or impaired connections between cells, can diminish the voltage provided by the battery. Battery drainage caused by small leakage currents or by high voltage domain short circuits can also impair battery performance.

Therefore; an electrified vehicle is equipped with a leakage detection circuit designed to detect and gauge the amount of current leakage present. A leakage detection circuit is typically in the form of either an ohmic circuit, in which a voltage across a detection resistor indicates the presence of leakage current, or an AC circuit, in which a change in impedance between high and low voltage domains indicates the existence of leakage current. Because leakage detection capability at an electrified vehicle is important, many leakage detection circuits are accompanied by a robustness check circuit designed to determine whether the leakage detection circuit is functional.

SUMMARY OF THE INVENTION

The present invention provides a circuit configured to continuously monitor leakage detection functionality. In an example embodiment, a circuit is coupled to positive and negative terminals of a high voltage energy storage device (ESD), such as a traction battery at an electric vehicle. A first ohmic voltage divider is coupled to the ESD positive terminal and a chassis, and a second ohmic voltage divider is coupled to the ESD negative terminal and the chassis. An example circuit can include a first differential amplifier configured to detect a voltage V1 at the first voltage divider, and a second differential amplifier configured to detect a voltage V2 at the second voltage divider. A first analog-to-digital converter is configured to receive input from both the first and second differential amplifiers and provide digitized V1 and V2 values to a processor module. The processor module can be configured to use the digitized V1 and V2 values to detect the presence of leakage current. Among its several advantages, the present circuit can be configured to continuously detect leakage current without the use of expensive switches commonly employed in prior art detection circuits.

A third voltage divider can be coupled to both the positive and negative terminals. A second analog-to-digital converter can be configured to provide a V3 value for a voltage detected at the third voltage divider. The processor module can be configured to use the V1, V2 and V3 values to perform a circuit robustness check. In an example embodiment, the processor module can be configured to use a V3 value to calculate a VT value that represents the potential between the positive and negative terminals. The processor module can be configured to use the calculated VT value to calculate a checkproduct CP; and use the V1 and V2 values to provide a sum VS. To determine whether the circuit is operating correctly, and thus providing adequate leakage detection capability, the processor module can be configured to compare VS to CP. The VS and CP values should be generally the same when the circuit is operating correctly. The processor module can initiate a fault response if the comparison indicates a circuit operation error. Rather than checking circuit robustness only at predetermined times, such as at the beginning of a drive cycle, the present circuit is configured to provide continuous robustness check capability.

A further advantageous aspect of a circuit of the invention is the ability to detect a balanced fault condition in which leakage resistances between a positive ESD terminal and a vehicle chassis, and between a negative ESD terminal and a vehicle chassis are substantially the same, and are both too low. In an example embodiment, a processor module can be configured to use a change in an ESD state of charge (SOC) to determine whether a balanced fault condition exists.

A method of the invention can include using voltages detected at various voltage dividers coupled to positive and/or negative terminals of an ESD to calculate a checkproduct that can be used to confirm that a circuit is operating correctly. An example method of the invention can include receiving a V1 value representing a voltage V1 detected at a first voltage divider coupled to a chassis ground and to a positive terminal of a high voltage energy storage device (ESD); receiving a V2 value representing a voltage V2 detected at a second voltage divider coupled to the chassis ground and to a negative terminal of the ESD; and receiving a V3 value representing a voltage V3 detected at a third voltage divider coupled to the positive and negative ESD terminals. An example method can further include using the V3 value to calculate a VT value representing a voltage potential between said positive and said negative terminals, and using the VT value to calculate a checkproduct CP. A method can further include using the V1 and V2 values to calculate a sum VS, and comparing VS to the checkproduct CP to determine whether a circuit fault exists. Finally, a method can include performing a fault response when a circuit fault is detected.

DETAILED DESCRIPTION OF EXAMPLE EMBODIMENTS

Example embodiments of the invention are presented herein; however, the invention may be embodied in a variety of alternative forms, as will be apparent to those skilled in the art. To facilitate understanding of the invention, and provide a basis for the claims, various figures are included in the specification. The figures are not drawn to scale and related elements may be omitted so as to emphasize the novel features of the invention. Structural and functional details depicted in the figures are provided for the purpose of teaching the practice of the invention to those skilled in the art and are not to be interpreted as limitations. The description presented below may use any of the terms isolation detection, leakage detection, leakage current detection to refer to a detection of leakage current. The description presented below may use any of the terms isolation fault, ground fault and leakage fault to refer to a fault that occurs when resistance between an ESD and a chassis is too low, enabling an unacceptable amount of leakage current to flow between the bus and the chassis. The terms circuit fault, robustness fault or operational fault may be used to refer to a fault in a circuit's operation.

Figure 1:
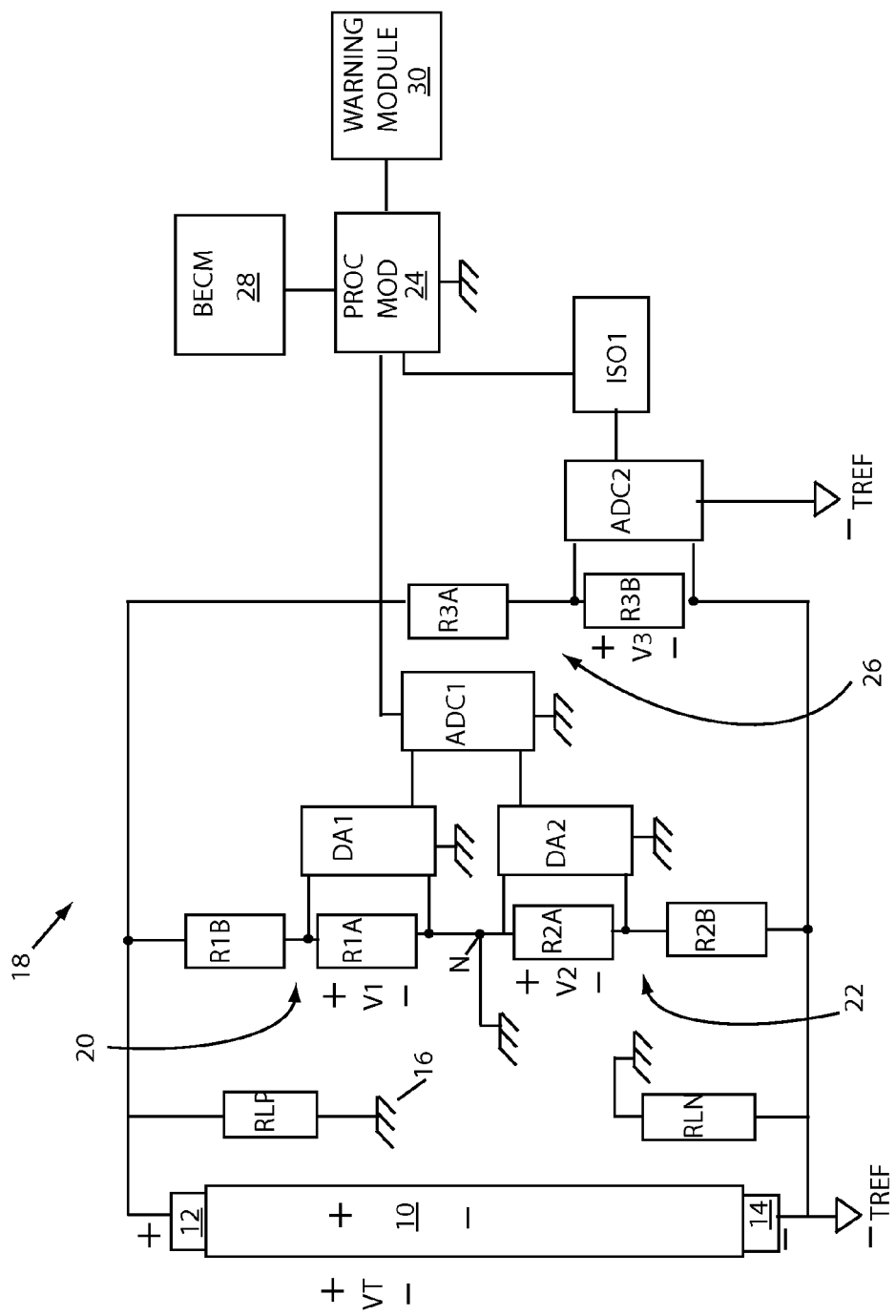
FIG. 1 shows an example circuit.

Turning now to the drawings, FIG. 1 shows a high voltage energy storage device (ESD) 10 having a positive terminal 12 and a negative terminal 14. By way of example, the ESD 10 can be in the form of a high voltage traction battery configured to provide sufficient propulsion power for an electrified vehicle. In an example embodiment, a traction battery can comprise a string of interconnected battery cells configured to provide a cumulative voltage that can range from 200-500V. The term "positive terminal" can refer to a positive-most terminal of a battery string, defined as the last positive terminal of a traction battery cell string that the wiring harness is coupled to for distributing power to a vehicle. Similarly, the term "negative terminal" can refer to a negative-most terminal of a battery string defined as the last negative terminal of a traction battery cell string that the wiring harness is coupled to for distributing power to a vehicle.

A high voltage domain at an electrified vehicle can include the ESD 10 and can distribute power to systems and components requiring substantially more than 12V, while a low voltage domain at an electrified vehicle can distribute power to components that require 12V or less. The high voltage domain can be galvanically isolated from the low voltage domain and the rest of an electrified vehicle. However, poor soldering, frayed cables, saltwater infiltration, or other contamination can reduce high voltage domain isolation and enable short circuits to occur between the high and low voltage domains. Even relatively small leakage currents can drain energy from a traction battery or other ESD used to provide traction power, adversely affecting vehicle performance.

The presence or absence of current leakage is often expressed in terms of a leakage resistance, as shown in FIG. 1 by RLP between the positive terminal 12 and a vehicle chassis 16, and RLN between the negative terminal 14 and the chassis 16. Although a minimal amount of current leakage may be tolerated, and perhaps expected, significant levels may not. Accordingly, electrified vehicles are equipped with leakage detection capability so that leakage faults (otherwise known as isolation faults or ground faults) can be promptly detected and addressed. A fault response can depend on the severity of the fault, and can range from a visual alert indicating that the vehicle should be checked, to a more urgent alert and response. Because leakage detection capability can be critical to electric vehicle operation, so too can be the ability to confirm that a leakage detection circuit is operating correctly.

The circuit 18 includes an ohmic leakage detection portion that comprises a first voltage divider 20 and a second voltage divider 22. The dividers 20 and 22 are coupled to each other at a node N that is coupled to the chassis 16. The first voltage divider 20 includes a resistor R1A coupled to the node N and connected in series to a resistor R1B that is coupled to the positive terminal 12. The second voltage divider 22 includes a resistor R2A coupled to the node N and connected in series with a resistor R2B that is coupled to the negative terminal 14. The ohmic resistances of the voltage dividers 20 and 22 can be configured so that there is some amount of current flow through the voltage dividers 20 and 22 during normal circuit 18 operation. Consequently, a voltage V1 across the resistor R1A (a first sense resistor), and a voltage V2 across the resistor R2A (a second sense resistor) will typically exist and can be detected. The V1 and V2 voltages can be used to gauge the magnitude of leakage current, or conversely the magnitudes of leakage resistances RLP and RLN, between the terminals 12, 14, and the chassis 16.

In an example embodiment, the resistors R1A and R2A are configured with identical ohmic values. Accordingly, the voltages V1 and V2 should be the same or substantially the same when the leakage resistances RLP and RLN are sufficiently high to prevent significant leakage current. However, if the leakage resistance RLN is too low, current will flow through the voltage divider 20 to the chassis 16 and to the negative terminal 14 of the ESD 10, bypassing the voltage divider 22. As a result, less current will flow through R2A, than through R1A, causing V2 to be less than V1. Likewise, if RLP is too low, current will flow through the voltage divider 22, the chassis 16 and RLP, bypassing the voltage divider 20. In this case V1 will be less than V2. Thus, a difference between V1 and V2 can indicate the presence of leakage current. Accordingly, circuit 18 can be configured to compare V1 and V2 values as part of a leakage detection process.

It is possible, however, that both RLP and RLN may be close to the same ohmic value, and both be too low, a leakage condition referred to as the Balanced Fault Condition. Fuel cell vehicles are particularly susceptible to the balanced fault conditions. Fuel Cells include a liquid channel that flows through the battery and has intimate connection with the battery cell string from the lowest potential to the highest potential. At the time of manufacture, a liquid channel has a very high impedance because the manufacturer uses a liquid with very low conductivity. Over time, however, contaminates can accumulate in the liquid and reduce the channel impedance. When the channel impedance becomes too low, the effective RLP and RLN can be too low and can be nearly identical, resulting in a balanced fault condition. Under this scenario, the same current flows through both voltage dividers, and the detected voltages V1 and V2 can be generally the same. Under a balanced fault condition, a fault detection process that relies solely on a comparison test of V1 and V2 may fail to detect an existing ground fault condition. Accordingly, the circuit 18 can be configured to perform an additional check to determine whether a balanced fault condition exists.

The circuit 18 is configured to operate without any switches to provide a lower-cost, more efficient means of leakage fault detection. Without switches, the same current can flow through both voltage dividers. Without switches, sensing of the voltages V1 and V2 can be performed simultaneously, allowing instantaneous values to be compared as part of a fault detection process. However, because V1 and V2 are associated with terminals of opposite polarity, it is desirable that they are referred to a common reference potential.

To acquire the desired leakage detection outputs V1 and V2, the circuit 18 includes a first differential amplifier DA1 configured to provide the voltage drop V1 across the resistor R1A. The DA1 is configured to provide an output referenced to the chassis ground 16. A separate second differential amplifier DA2, also grounded to the chassis 16, is configured to detect the voltage drop V2 across the resistor R2A. The separate differential amplifiers DA1 and DA2 allow simultaneous detection of the two voltages V1 and V2. Because DA1 and DA2 are both grounded to the chassis 16, their outputs are referenced to a common ground reference, and each can provide its output to an analog-to-digital converter ADC1 tied to the chassis ground 16. The ADC1 is configured to provide its output, namely digital V1 and V2 values for the V1 and V2 voltages respectively, to a processor module 24.

The processor module 24 can comprise a digital processor configured to execute logic encoded on a computer-readable medium and having instructions for performing various leakage detection and robustness check calculations and operations. The processor module 24 can comprise a memory configured for short-term and/or long-term data storage. For example, a memory can comprise random-access memory (RAM) at which input provided by the ADC1 and the ADC2, other input received at the processor module 24, and values calculated at the processor module 24 can be stored. The processor module 24 can also comprise read-only memory (ROM) for storing instructions for a digital processor, as well as predetermined fault thresholds or ranges, and/or other quantities as needed.

When the ESD 10 is embodied as a traction battery for an electrified vehicle, the processor module 24 and/or the circuit 18 can be coupled to a battery energy control module (BECM) 28 configured to control and monitor operation of a traction battery. By way of example, but not limitation, the BECM 28 can be configured to monitor battery state of charge, control battery charging operations, and control relays (not shown) configured to couple a battery to a power conversion system for an electric vehicle. Shown here for illustrative purposes as a separate module from the BECM 28, it is contemplated that the circuit 18 can be integrated with the BECM 28. In an example embodiment, the processor module 24 is grounded to the chassis 16, thereby sharing a common ground reference with the ADC1.

The processor module 24 is configured to use the V1 and V2 values to determine whether a leakage fault (or ground fault) condition exists. Various strategies can be implemented to do so, including those that compare voltage values and those that calculate leakage resistances. As described above, V1 and V2 should be generally the same during no-fault conditions, so a fault detection process can include comparing the two. Accordingly, in an example embodiment, the processor module 24 is configured to calculate the difference between V1 and V2. If the difference between them fails to fall within an acceptable tolerance range, by way of example, defined by a predetermined percentage (for example 5%) of V1, a determination can be made that a leakage fault condition exists.

As discussed earlier herein, a comparison of V1 and V2 alone may not be sufficient to detect an existing fault. Under a balanced fault condition, the voltages V1 and V2 can be substantially the same. Accordingly, the processor module 24 can be configured to perform a check for a balanced fault condition. When both RLP and RLN are both equally too low, leakage current can flow to the chassis 16 from both the positive and negative terminals 12, 14. VR1 and VR2 can be equal to each other, under this type of "double" fault or "balanced" fault condition. To address this possibility, the processor module 24 can be configured to perform a second test to determine whether a balanced fault condition exists. In an example embodiment, the processor 24 can be configured to determine whether the magnitude of a sensed voltage falls within an acceptable range. In an example embodiment, the processor module 24 can be configured to compare the magnitude of V1 or V2 to a threshold value. If either V1 or V2 rises too far above the threshold value, a ground fault can be indicated. By way of example, a threshold value can be based on a predicted value under no leakage conditions. Knowing the ohmic values of R1A, R1B, R2A, R2B, values for the voltages V1 and V2 can be predicted for normal operation of the circuit 18 under no leakage conditions. A "no-fault" value can be calculated and used as a reference. In an example embodiment, with R1A=R2A, a predetermined no-fault value $V_{REF}$ can be calculated by $$V_{REF} = VT \times \frac{R1A}{R1B + 2R1A + R2B} \quad (1)$$

Given the baseline no-fault value $V_{REF}$, a threshold voltage VTH can be calculated as a percentage of VREF, and V1 and/or V2 can be compared to VTH to detect the presence of a leakage fault. For example, VTH can be set to 98% of VREF, and the processor module 24 can be configured to determine the difference ΔV between V1 and/or V2 and VTH. A ground fault is indicated when the difference becomes too large.

As an alternative check for a balanced fault condition, in an example embodiment, the processor module 24 can be configured to determine whether the state of charge (SOC) of the ESD 10 changes while the vehicle is turned off; a decrease can be indicative of a balanced leakage fault. For example, the processor module 24 can be configured to assess the SOC when a vehicle is keyed off to provide a first SOC value, and to assess the SOC after the vehicle has been turned off for a period of time to provide a second SOC value. The processor module 24 can be configured to determine the difference between the first and second SOC values, and determine whether the difference is indicative of a balanced fault condition. For example, the processor module 24 can be configured to compare the difference to a predetermined threshold to determine whether a fault condition exists. The processor module 24 can be configured to perform a fault response when a balanced fault condition is detected.

In an example embodiment, the processor module 24 can be configured to assess the State of Charge (SOC) of the ESD (10) by measuring the ESD 10 voltage. For example, when the ESD 10 is in the form of a traction battery pack, the processor module 24 can measure the pack voltage between the terminals 12 and 14 (FIG. 1). The processor module 24 can be configured to perform an Open Circuit Voltage (OCV) calculation to assess the SOC of the ESD 10. Alternatively, the processor module 24 can be configured to receive an SOC value from the BECM 28. Additional mechanisms not shown in FIG. 1 can provide additional ways to measure the ESD 10 SOC. For example, a current sensor subsystem (not shown) can be configured to perform amp-hour integration on the ESD 10 to provide an SOC; alternatively individual cell voltages can be measured and combined to provide an ESD 10 SOC. Alternative means for assessing SOC will occur to those skilled in the art.

It is contemplated that the circuit 18 can be configured to detect leakage current in various ways. For example, the processor module 24 can be configured to calculate values for the leakage resistances RLP and RLN. The processor module 24 can be configured to use the detected voltages V1, V2 and V3, and the ohmic values for the resistors R1A, R1B, R2A, R2B, R3A and R3B to calculate RLP and RLN. The microprocessor can be configured to compare RLP and RLN to a predetermined minimum threshold, and determine that a leakage fault exists when either of the leakage resistances fails to satisfy the threshold requirement. The processor module 24 can be configured to perform a fault response in response to a determination that a leakage fault is present. In an example embodiment, the processor module 24 is configured to perform a fault response only when a leakage detection circuit passes a robustness check that confirms that the leakage detection circuit is functioning satisfactorily. It is contemplated that a fault response can be dependent on the amount of leakage detected, and can range from an operator warning to decoupling of an ESD from an electric drive system. For example, if significant leakage is detected the processor module 24 can provide a fault signal to the BECM 28, which can be configured to prevent closure of relays that couple the ESD 10 to the rest of a vehicle's electric drive system. In addition, the processor module 24 can be configured to provide an operator warning. For less significant current leakage, a fault response can be limited to an operator warning, such as an indication that the vehicle should be serviced. For example, the processor module 24 can be configured to provide a fault signal to a warning module 30 that can be configured to provide a visual, audible or haptic warning or alert to an operation. By way of example, the warning module 30 can be configured to illuminate an icon that can appear at a vehicle dashboard or other display.

Fault detection by a leakage detection circuit is as reliable as the leakage detection circuit itself. Accordingly, the circuit 18 includes a robustness check, alternatively referred to as a circuit check, to confirm satisfactory circuit operation. As discussed above, the processor module can be configured to use V1 and V2 values to detect a ground fault. By way of example, a circuit check aspect of the invention can be configured to check circuit functionality by checking DA1, DA2, and ADC 1 operation, for example by checking the V1 and V2 values that they provide. V1 and V2 have a known relationship with respect to the voltage VT between the positive terminal 12 and the negative terminal 14. Thus, in an example embodiment, the processor module 24 can be configured to perform a robustness check by determining an instantaneous value for VT and confirming that the instantaneous values of V1 and V2 provided by the ADC 1 satisfy the equality condition.

In an example embodiment, the circuit 18 includes a third voltage divider 26, coupled to both the positive terminal 12 and to the negative terminal 14, which can be used to determine the instantaneous value of VT. The third voltage divider 26 can comprise a first resistor R3A coupled to the negative terminal 14 (having a potential—TREF), and a second resistor R3B, coupled to the positive terminal 12, and connected in series to the resistor R3A. A second analog-to-digital converter, ADC2, can be configured to provide a digitized output representing the voltage drop V3 across the resistor R3A (a third sense resistor). While not shown explicitly in FIG. 1, it is contemplated that additional electronic devices, such as an operational amplifier, a filter, etc. may be included in the coupling of the ADC2 to the voltage divider 26. Just as the ADC1 shares a common ground with its input providers, the DA1 and DA2, the ADC2 is configured to share a common ground, namely the negative terminal 14, with the voltage divider 26. Tying the ADC2 to the negative terminal 14 of the ESD 10 facilitates accurate detection of the voltage VT across the ESD 10 between the positive and negative terminals 12, 14. Like the ADC1, the ADC 2 is configured to provide its digital output to the processor module 24. Because the ADC 2 is grounded to the high voltage domain, and the processor module 24 is part of the low voltage domain and grounded to the chassis 16, an example embodiment can include a serial peripheral interface (SPI) isolator ISO1 disposed as an interface that can provide galvanic isolation between the two. In an example embodiment, the processor module 24 can be configured to set clock frequency, clock polarity and phase parameters for data communication between the ISO1 and the processor module 24.

In an example embodiment, the processor module 24 is configured to calculate VT using the voltage V3 detected across R3A. For example, knowing the ohmic values of R3A and R3B, and the V3 value, the voltage VT can be calculated as shown below:

$$V_T = V_3 \times \frac{R3A + R3B}{R3B} \tag{2}$$

Given the circuit 18 configuration shown in FIG. 1, it can be seen that the voltages V1 and V2 are related to the voltage VT as well as to the ohmic values of R1A, R1B, R2A, R2B, R3A and R3B. In particular, the relationship between the voltages V1 and V2 and VT and can be expressed as:

$$V1 + V2 = K * VT \tag{3}$$

Where $$K = \frac{R1A + R2A}{R1A + R1B + R2A + R2B} \tag{4}$$

Ohmic values of the resistors R1A, R1B, R2A, R2B, R3A and R3B can be stored at the processor module 24. A value for the constant K can also be stored at the processor module 24. During circuit 18 operation, the processor module 24 can be configured to calculate VT by performing the operation indicated by (2) above with a V3 value provided by the ADC2. In addition, the processor module 24 can be configured to use a received V3 value and the stored K value to calculate and store a checkproduct CP, where CP is expressed by the following equation:

$$CP = K \times V_T \tag{5}$$

Using the V1 and V2 values provided by the ADC1, the processor module 24 can be configured to calculate the sum VS:

$$VS = V1 + V2 \tag{6}$$

Having calculated VS and CP, the processor module 24 can be configured to determine whether the equality condition expressed by (3) is satisfied. For example, the processor module 24 can be configured to determine whether VS is substantially the same as CP. In an example embodiment, this determination can comprise determining whether VS falls within a predetermined tolerance range based on percentage of CP. For example, the term "substantially the same" may require VS to be within 5% of CP. Accordingly, an acceptable range for VS can be defined by:

$$0.95CP \leq VS \leq 1.05CP \tag{7}$$

The processor module 24 can be configured to determine whether a calculated VS value falls within the range defined by (7). If it does, the processor module 24 can be configured to determine that the circuit 18 is operated normally, with no circuit fault, and that leakage fault detection capability is adequate. If a calculated VS value falls outside the range defined by (7), the processor module can be configured to determine that the robustness check failed, indicating that a circuit fault condition exists, and fault detection capability may be impaired. Alternatively, the processor module 24 can be configured to calculate a difference between the sum VS and the checkproduct CP and determine whether the difference falls within a predetermined tolerance range. Other ways of defining acceptable ranges and/or fault thresholds may occur to those skilled in the art. It is contemplated that a plurality of thresholds can be used to categorize the severity or significance of the fault. Thus, the circuit 18 can be configured to use instantaneous values for V1, V2, and CP to provide dynamic and continuous robustness check capability. When a robustness check fails, indicating the presence of a circuit fault, the processor module 24 can be configured to perform a fault response. In an example embodiment, the processor module 24 can provide a fault signal to the warning module 30. The warning module 30 can be configured to provide a visual, audible or haptic warning to an operator. For example, the warning module 30 can cause an icon, diagnostic code or text warning to be illuminated at a display, indicating that the vehicle should be serviced. In an example embodiment, the warning module 30 can comprise a display screen and a speaker for providing an alert. Alternatively, the warning module 30 can be configured to use a dashboard display and/or vehicle speaker to provide an alert. In an example embodiment, the a fault response by the processor module 24 can include providing a fault signal to the BECM 28, which can be configured to prevent initiation of a drive mode at the vehicle. It is contemplated that the processor module can be configured to provide a fault response based on the significance of the fault. For example, if the sum VS does not equal CP, but comes within 5% of CP, a determination can be made that a minor fault exists. A fault response to detection of a minor fault can comprise an operator warning. In an example embodiment, leakage detection and leakage fault response can be performed as usual during a minor fault condition. If the difference between VS and CP is greater than 5%, a determination can be made that a major circuit fault exists that renders the circuit 18 incapable of accurate leakage detection. A response to a major fault can include no longer performing a leakage check, performing a leakage check but not a leakage fault response, and/or providing a fault signal to the BECM 28 to prevent initiation of a drive mode.

Figure 2A:
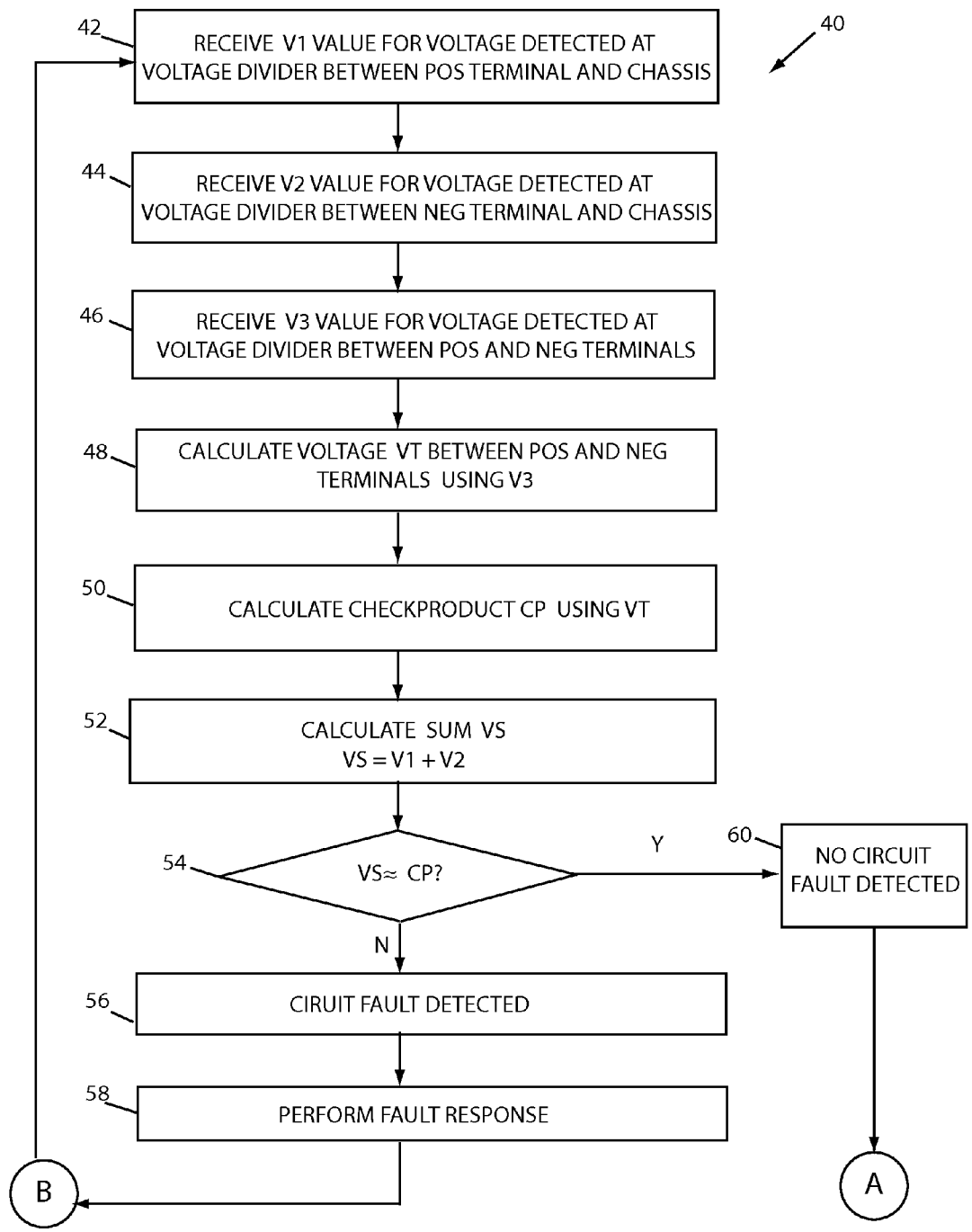
FIG. 2A shows an example method performed at the circuit depicted in FIG. 1.

FIG. 2 depicts a flow diagram of an example method 40 of the invention. As discussed above, the lack of switches at the circuit 18 allows the voltages V1, V2 and V3 to be detected at the same or substantially the same time instant $t_i$. The index i is used below to illustrate that voltage values associated with the same point in time can be used to provide a dynamic and continuous fault determination output. At block 42 a value for a voltage sensed at a voltage divider coupled between a positive terminal and a chassis can be received. For example, the processor module 24 can receive and store a V1($t_i$) value from the AD1. At block 44, a voltage sensed at a voltage divider disposed between a negative terminal and the chassis can be received. For example, the processor module 24 can receive and store a voltage V2($t_i$) from the ADC1. At block 46, a voltage detected at a voltage divider disposed between positive and negative terminals can be received. For example, the processor module 24 can receive and store the voltage V3($t_i$), from the ADC 2. At block 48 a voltage VT(ti) between positive and negative terminals 12 and 14 can be calculated. For example, the processor module 24 can calculate VT($t_i$) by using V3($t_i$) and (2) above.

After the instantaneous voltage VT($t_i$) between the positive and negative terminals 12 and 14 is calculated, the method can proceed to block 50 at which an instantaneous checkproduct can be calculated. For example, the processor module 24 can calculate and store CP($t_i$) using the equation (5) and the VT($t_i$) calculated at block 48. At block 52, a sum of the voltages detected at the first and second voltage dividers coupled between the chassis and the positive and negative terminals respectively can be calculated. For example, the processor module 24 can add V1($t_i$) and V2(ti) to provide VS(ti).

At the decision block 54 a determination can be made as to whether VS($t_i$) is substantially the same as the checkproduct CP($t_i$). In an example embodiment, the processor module 24 uses (7) to determine whether VS($t_i$) falls within an acceptable tolerance range. If it is not, at block 56 a determination is made that a fault condition exists. This determination would indicate that leakage detection capability at a circuit is compromised. Thus, at block 58 a fault response can be performed. For example, the processor module 24 can provide a fault signal to the warning module 30 which can be configured to provide an operator alert, such as a visual, audible or haptic alert. Although not explicitly described in method 40, it is contemplated that the severity of a detected circuit fault can be determined, and the type of fault response performed can be based on the severity of the fault. In addition, in an example embodiment, whether a subsequent leakage check is performed can also depend on the severity of a detected circuit fault.

Conversely, if VS(ti) does fall within a predetermined tolerance range, a determination can be made at block 60 that no fault is detected; i.e. that circuit 18 is functioning properly and can therefore provide satisfactory leakage detection capability. At this point a robustness check for time instant $t_i$ is completed.

Figure 2B:
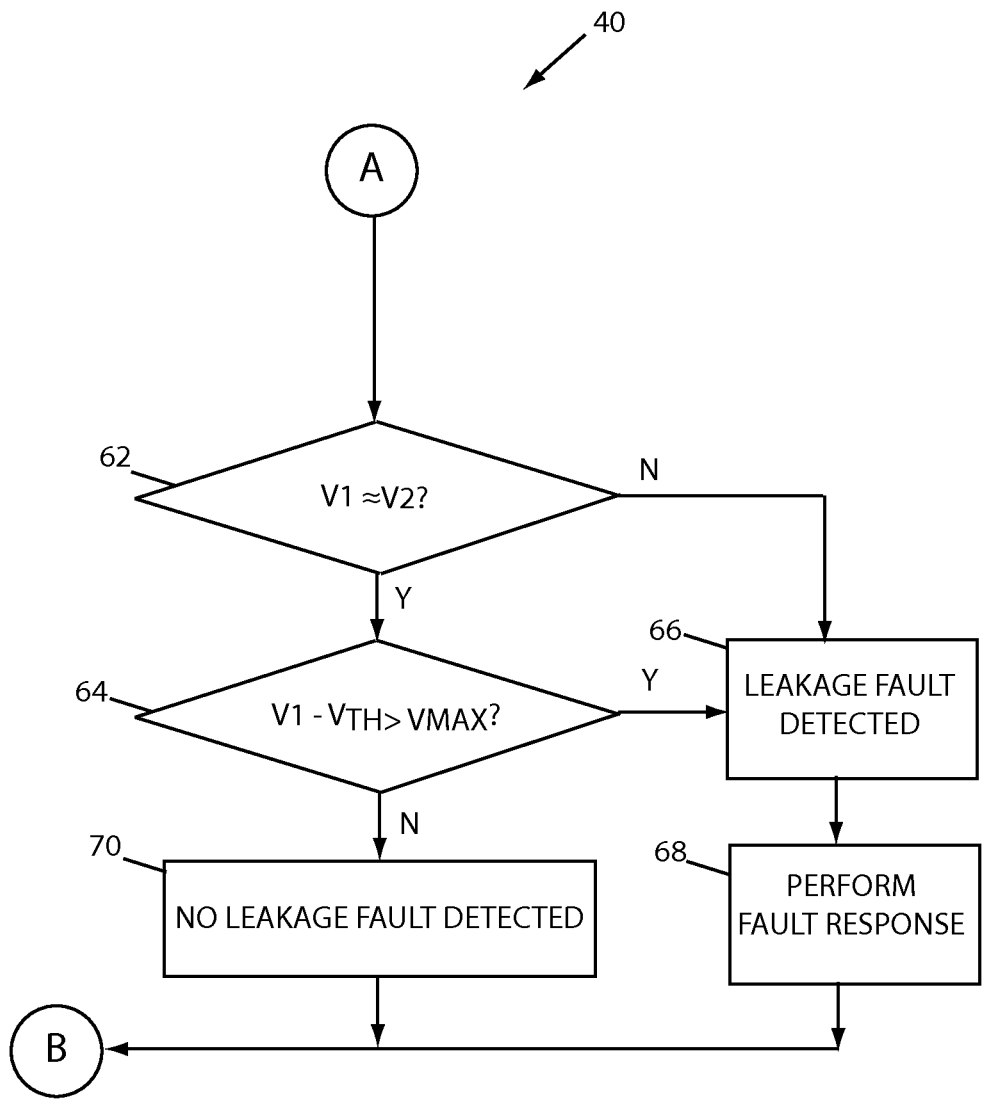
FIG. 2B shows continuation of the example method depicted in FIG. 2A.

As shown in FIG. 2B, the example method 40 can continue with a test to determine whether leakage current exists. The leakage test of the method 40 includes the two-part test discussed earlier herein, and can be initiated at block 62 where a determination can be made as to whether a voltage detected at the first voltage divider is substantially the same as a voltage detected at the second voltage divider. In an example method, the processor module 24 can determine whether V1($t_i$) and V2($t_i$) are substantially the same. By way of example, the module 24 can determine whether V2($t_i$) falls within a predetermined range defined by a lower threshold of 0.95 V1($t_i$) and an upper bound of 1.05 V1(ti). If V2($t_i$) fails to fall within this range, a leakage fault determination can be made at block 66, and a leakage fault response can be performed at block 68.

If, however, V2($t_i$) is substantially the same as V1($t_i$), the processor module 24 can perform a test to determine whether a balanced fault condition is present. At block 64, at least one of the voltages detected at either the first voltage divider or the second voltage divider can be compared to a threshold value. For example, the processor module 24 can determine the difference between V1($t_i$) and VTH. If the difference is greater than a predetermined maximum VMAX, a fault determination can be made at block 66 and a fault response performed at block 68, for example a fault response can comprise sending a fault signal to the warning module 30. In an example embodiment, the fault signal provided by the processor module 24, and the alert provided by warning module 30 in response to a leakage fault can be different than those provided in response to a robustness fault. Furthermore, as discussed above, the processor module 24 can be configured to determine the severity of a detected leakage fault and provide a fault response based on the determination. However, if the difference between V1($t_i$) and VTH is less than VMAX, then at block 70 a determination can be made that no leakage fault is detected. The method 30 can be repeated continuously with updated values for V1 and V2.

Figure 3:
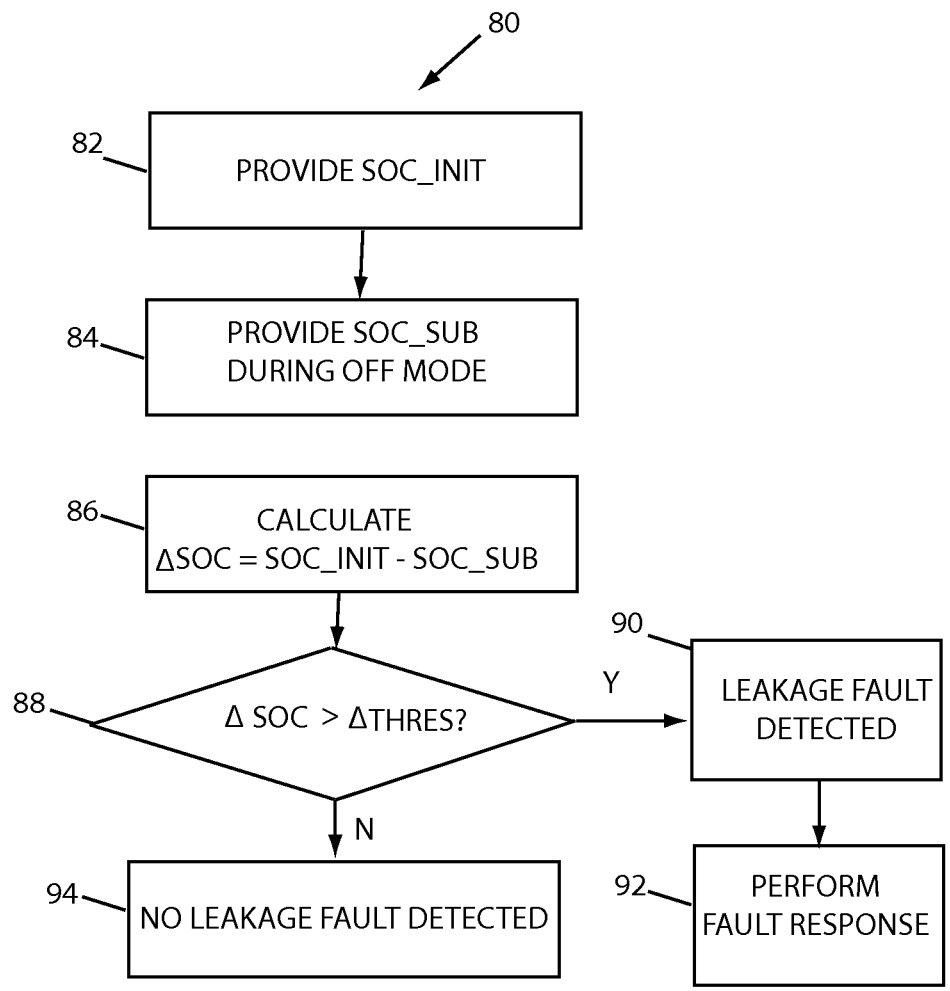
FIG. 3 shows a method for detecting a balanced fault condition.

FIG. 3 shows an alternative method 80 for checking for the presence of a balanced fault condition. The method 80 can be performed in addition to or in lieu of the comparison of V1 or V2 to a predetermined threshold as shown in FIG. 2B. In an example embodiment it can be performed routinely in conjunction with method 40. However it is contemplated that it can be performed in response to a determination that V1 and V2 are substantially equal. At block 82 an initial SOC value, SOC_init can be provided. For example, in response to a KEY-OFF at a vehicle, the processor module 24 can provide and store an SOC_INIT value. By way of example, the processor module 24 can receive the SOC from the BECM 28, or can calculate the SOC by measuring the voltage between the terminals 12 and 14 and performing an open circuit calculation. At block 84, a second subsequent SOC value, SOC_SUB, derived while a vehicle remains in the KEY-OFF state can be provided. For example, the processor module 24 can be configured to "wake-up" and be energized after the vehicle has been in the KEY-OFF state for a predetermined period of time. By way of the example, the period of time can be around 2 hours. Having been energized, the processor module 24 can be configured to provide a second SOC, SOC_SUB, by any of the aforementioned methods. At block 86, the difference between the initial SOC determined when the vehicle was keyed off, and the second SOC determined after the vehicle had been in a keyed off state for a predetermined period of time, can be calculated. For example, the processor module 24 can calculate the difference between SOC_INIT and SOC_SUB. At block 88 a determination can be made as to whether the difference is larger than a predetermined threshold. For example, the processor module 24 can compare ΔSOC to a predetermined threshold. By way of example, ΔSOC_THRES can be around 5% of SOC_INIT. If the SOC difference exceeds the threshold, a determination that a balanced fault condition exists can be made at block 90, and a fault response can be performed at block 92. If the SOC difference fails to exceed the predetermined threshold, a determination that no balanced fault condition exists can be made at block 94.

Figure 4:
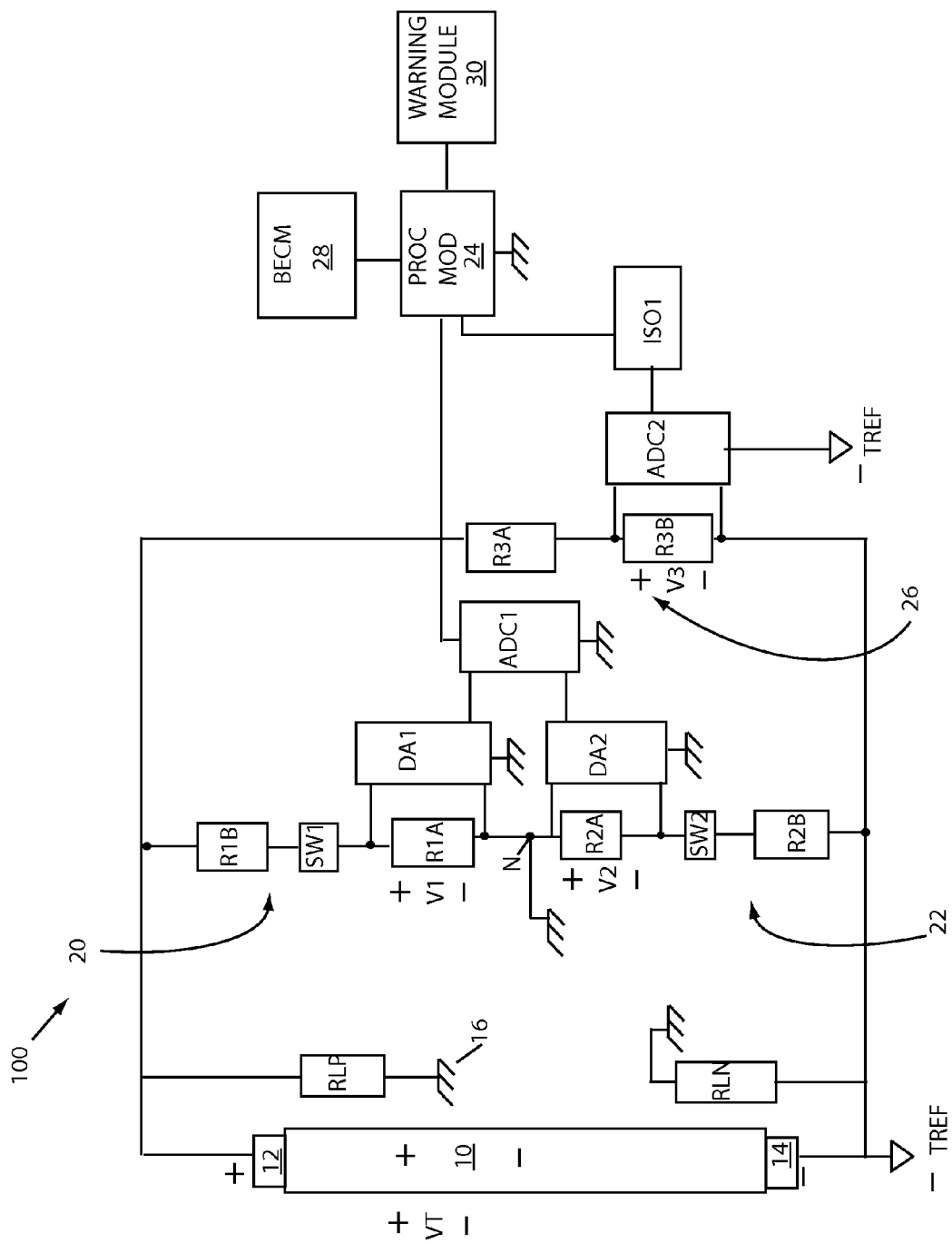
FIG. 4 shows an alternative example circuit.

Thus the invention provides a system and method for providing a robustness check for a leakage detection circuit. A circuit with an integrated robustness check can operate without switches to provide continuous confirmed fault detection capability. However, as shown in FIG. 4, it is contemplated that in an example embodiment, a circuit of the invention can include switches SW1 and/or SW2 that can be configured to enable controllable connection and disconnection of the voltage dividers 22 and 26. By way of example, the processor module 24 can be configured to control operation of the switches SW1 and SW2. The use of appropriately grounded ADC's enables a low voltage domain digital processor to use dynamically detected high voltage domain voltages in calculations configured to check detection circuit operation as well as detect leakage current. Detection of a circuit fault or a leakage fault can trigger a fault response that can depend on the severity of the fault. Balanced leakage fault conditions can be detected, as well as leakage faults associated with only one ESDs terminal.

As required, illustrative embodiments have been disclosed herein, however the invention is not limited to the described embodiments. As will be appreciated by those skilled in the art, aspects of the invention can be variously embodied, for example, additional circuit components such as amplifiers, filters, etc. not specifically depicted in the drawings can be included to perform the functions described herein. Methods are not limited to the particular sequence described herein and may add, delete or combine various steps or operations. The invention encompasses all systems, apparatus and methods within the scope of the appended claims.

What is claimed:

1. A circuit, comprising:
   a first differential amplifier (DA) configured to detect a voltage V1 at a first voltage divider, said first voltage divider coupled to a chassis and to a positive terminal of a high voltage energy storage device (ESD);
   a second DA configured to detect a voltage V2 at a second voltage divider, said second voltage divider coupled to said chassis and to a negative terminal of said ESD;
   a first analog-to-digital converter (ADC) configured to digitize said V1 voltage to provide a V1 value, and digitize said V2 voltage to provide a V2 value;
   a third voltage divider coupled to said ESD positive and negative voltage terminals;
   a second ADC configured to digitize a voltage V3 detected at said third voltage divider to provide a V3 value;
   a digital processor configured to use said V3 value to calculate a VT value representing a voltage between said positive and negative terminals;
   wherein said digital processor is configured to use said VT value to calculate a checkproduct CP;
   wherein said digital processor is configured to add said V1 and V2 values to provide a sum VS; and
   wherein said digital processor is configured to compare said VS to said CP to determine whether a circuit fault exists.

2. The circuit of claim 1, wherein said digital processor is configured to determine that said circuit is functioning properly when said VS falls within a predetermined tolerance range.

3. The circuit of claim 1, wherein said digital processor is configured to perform a fault response when a determination is made that a circuit fault exists.

4. The circuit of claim 3, wherein said fault response comprises providing a fault signal configured to trigger an operator alert.

5. The circuit of claim 1, wherein said CP is calculated by multiplying said VT value by a constant K.

6. The circuit of claim 5, wherein said constant K is calculated by $$K = \frac{R1A + R2A}{R1A + R1B + R2A + R2B},$$

where R1A is an ohmic value of a sense resistor of said first voltage divider, R2A is an ohmic value of a sense resistor of said second voltage divider, R1B is an ohmic value of said first voltage divider second resistor, and R2B is an ohmic value of said second voltage divider second resistor.

7. The circuit of claim 1, wherein said second ADC is grounded to a negative terminal of said ESD.

8. The circuit of claim 1, wherein said digital processor is configured to compare said V1 value to said V2 value to determine whether a leakage current is present.

9. The circuit of claim 1, wherein said digital processor is configured to compare at least one of said V1 and said V2 values to a predetermined threshold to determine whether leakage current exists.

10. The circuit of claim 1, wherein said digital processor is configured to provide a fault signal in response to detection of a leakage fault.

11. The circuit of claim 1, wherein said fault signal is configured to prevent closure of relays coupling said ESD to an electric drive system at a vehicle.

12. The circuit of claim 1, wherein said ESD comprises a traction battery for an electrified vehicle.

13. The circuit of claim 1, further comprising at least one switch to controllably operate at least one of said first and second voltage dividers.

14. A method, comprising:
   receiving at a processor module a V1 value representing a first voltage detected at a first voltage divider, said first voltage divider coupled to a chassis and to a positive terminal of an energy storage device (ESD);
   receiving at said processor module a V2 value representing a second voltage detected at a second voltage divider, said second voltage divider coupled to said chassis and to a negative terminal of said ESD;
   receiving at said processor module a V3 value representing a third voltage detected at a third voltage divider, said third voltage divider coupled to said positive and negative terminals;
   said processor module calculating a VT value representing a voltage between said positive and negative voltage terminals;
   said processor module using said VT value to calculate a checkproduct CP;
   said processor module using said V1 and V2 values to calculate a sum VS; and
   said processor module comparing said VS to said CP to determine whether a circuit fault exists.

15. The method of claim 14, wherein said using said VT value to calculate a checkproduct CP comprises multiplying said VT value by a constant K.

16. The method of claim 15, wherein said constant K is dependent on an ohmic resistance of at least one of said first and second voltage dividers.

17. The method of claim 14 wherein said receiving said V1 value comprises receiving said V1 value from an analog-to-digital converter coupled to said chassis and configured to digitize a voltage detected by a differential amplifier coupled to said first voltage divider.

18. The method of claim 14, further comprising providing a fault signal when said circuit fault determination indicates existence of a circuit fault.

19. The method of claim 14, further comprising said processor module performing a check for current leakage.

20. The method of claim 19, wherein said performing a check for current leakage comprises comparing said V1 value to said V2 value.

21. The method of claim 19, wherein said performing a check for current leakage comprises comparing a first SOC value to a second SOC value.

22. The method of claim 19, further comprising said processor module providing a fault signal when said leakage current check indicates existence of a leakage fault.

* * * * *